United States Patent
Li et al.

(10) Patent No.: US 9,269,617 B2
(45) Date of Patent: Feb. 23, 2016

(54) VIA NETWORK STRUCTURES AND METHOD THEREFOR

(71) Applicant: NXP B.V., Eindhoven (NL)

(72) Inventors: Yuan Li, Malden (NL); Som Nath, Arnhem (NL); Maarten van Dort, Arnhem (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/514,570

(22) Filed: Oct. 15, 2014

(65) Prior Publication Data

US 2015/0072520 A1    Mar. 12, 2015

Related U.S. Application Data

(62) Division of application No. 13/079,579, filed on Apr. 4, 2011, now Pat. No. 8,896,124.

(51) Int. Cl.
*H01L 21/326* (2006.01)
*H01L 21/768* (2006.01)
*H01L 23/00* (2006.01)

(52) U.S. Cl.
CPC .... *H01L 21/76877* (2013.01); *H01L 21/76805* (2013.01); *H01L 24/05* (2013.01); *H01L 2224/02166* (2013.01); *H01L 2224/0392* (2013.01); *H01L 2224/0401* (2013.01); *H01L 2224/04042* (2013.01); *H01L 2224/05025* (2013.01); *H01L 2224/05086* (2013.01); *H01L 2224/05088* (2013.01); *H01L 2224/05093* (2013.01); *H01L 2224/05096* (2013.01); *H01L 2224/05098* (2013.01); *H01L 2224/05556* (2013.01); *H01L 2224/45124* (2013.01); *H01L 2924/00013* (2013.01); *H01L 2924/00014* (2013.01); *H01L 2924/01029* (2013.01)

(58) Field of Classification Search
CPC ................... H01L 27/76805; H01L 21/76877; H01L 24/05
USPC ........................... 257/758, 773, 774; 438/666
See application file for complete search history.

(56) References Cited

U.S. PATENT DOCUMENTS 5,210,682 A    5/1993   Takashima
5,491,364 A    2/1996   Brandenburg et al.
(Continued)

FOREIGN PATENT DOCUMENTS

| CN | 1639865 | 7/2005 |
| CN | 101459172 | 6/2009 |
| CN | 102738104 | 10/2012 |

OTHER PUBLICATIONS

Ker, Ming-Dou. "Fully Process-Compatible Layout Design on Bond Pad to Improve Wire Bond Reliability in CMOS ICs." IEEE Transactions on Components and Packaging Techologies (vol. 25, No. 2). Jun. 2002. pp. 8.

(Continued)

*Primary Examiner* — Hung Vu

(57) ABSTRACT

A circuit device is configured with robust circuit connectors. In connection with various example embodiments, an integrated circuit device includes one or more via network layers below a bond pad contact, connecting the bond pad contact with one or more underlying metal layers. Each via network layer includes a plurality of via strips extending about parallel to the bond pad contact and in different directions to structurally support the bond pad contact.

9 Claims, 9 Drawing Sheets

Cross-section A-A

(56) References Cited

U.S. PATENT DOCUMENTS

| | | |
|---|---|---|
| 5,700,735 A | 12/1997 | Shiue et al. |
| 5,707,894 A | 1/1998 | Hsiao |
| 5,847,466 A | 12/1998 | Ito et al. |
| 5,986,343 A | 11/1999 | Chittipeddi et al. |
| 6,100,589 A * | 8/2000 | Tanaka ................ 257/758 |
| 6,165,886 A | 12/2000 | Lin et al. |
| 6,313,540 B1 * | 11/2001 | Kida et al. ............. 257/784 |
| 6,444,295 B1 | 9/2002 | Peng et al. |
| 6,614,091 B1 | 9/2003 | Downey et al. |
| 6,717,270 B1 | 4/2004 | Downey et al. |
| 6,825,541 B2 | 11/2004 | Huang et al. |
| 6,879,015 B2 | 4/2005 | Liang et al. |
| 6,897,570 B2 | 5/2005 | Nakajima et al. |
| 6,998,335 B2 | 2/2006 | Fan et al. |
| 7,217,656 B2 | 5/2007 | Test et al. |
| 7,535,104 B2 | 5/2009 | Test et al. |
| 7,701,063 B2 | 4/2010 | Kanzaki et al. |
| 8,178,981 B2 | 5/2012 | Kanzaki et al. |
| 2006/0065969 A1 | 3/2006 | Antol et al. |
| 2012/0248623 A1 | 10/2012 | Li et al. |

OTHER PUBLICATIONS

Saran, Mukul et al. "Elimination of Bond-pad Damage Through Structural Reinforcement of Intermetal Dielectrics." IEEE 98CH36173 36th Annual International Reliability Physics Symposium, Reno, Nevada 1998. pp. 7.

* cited by examiner

Cross-section A-A

Cross-section B-B

VIA NETWORK STRUCTURES AND METHOD THEREFOR

CROSS-REFERENCE TO RELATED APPLICATIONS

This application is a division of co-pending application Ser. No. 13/079,579, filed on Apr. 4, 20113, the contents of which are incorporated by reference herein.

Various aspects of the present invention are directed to integrated circuits, and more particularly to circuit connectors and via networks for integrated circuits.

A variety of different types of integrated circuits and related components are susceptible to undesirable stresses and other conditions during and after the manufacturing process. For example, mechanical damage to the bond-pads of an integrated circuit (IC) is a general manufacturing and reliability concern for the IC industry. Such damage may occur, for example, due to probing (e.g., during functional tests) or wire-bonding or metal bumping (e.g., during chip packaging), and may involve pad metal peeling-off due to poor adhesion of the pad with the underlying IMD (e.g., as related to temperature and/or bonding). Similar damage may occur in both Al-based and Cu-based interconnect technologies. Wire-bonding induced pad damage, such as that triggered/enhanced by probing-induced damage on the pads before chip packaging, may cause line yield loss in the assembly fabrication (e.g., due to metal-peel-off and bonding loss, and other conditions). This leads to poor product reliability, for example, as resulting from metal-peel-off and lifted bonding after temperature cycles in the field or during the life test of the product. These problems can be more troublesome with Cu-based wire bonding for chip packaging.

To address such problems, significant effort is often taken to qualify wafer fabrication processes and/or new products during manufacturing, especially for challenging application conditions such as in automotive circuits. In some cases, additional pads are added to reduce or eliminate the interaction between probing and bonding damages. Pad material that is stronger and/or harder can also be used, but achieving robust strength throughout an integrated circuit (e.g., due to other relatively weak portions therein) remains challenging. For example, inter-metal dielectrics are generally brittle in nature, and may be cracked during probing, wire-bonding or metal bumping. These cracks may become enlarged during a wire-pull test, or during temperature cycling in a life test or application in the field, leading to a lifted bond ball or even peeling-off of a pad stack.

Accordingly, the manufacturing and implementation of a variety of integrated circuit chips continues to be challenging.

Various example embodiments are directed to circuit connectors (e.g., bond pads) with integrated via networks for a variety of integrated circuit applications and addressing various challenges, including those discussed above.

Various embodiments are directed to an integrated circuit device that provides a surface over a structural aspect of the integrated circuit device, and includes at least one bond pad contact at the surface. The device further includes a plurality of via network layers below each bond pad contact and connecting the bond pad contact with one or more metal layers. Each via network layer includes a plurality of via strips configured and arranged extending about parallel to the surface and in different directions to facilitate structural support of the bond pad contact. An insulating material is located between the via strips in each layer.

Another example embodiment is directed to a method for manufacturing an integrated circuit device that provides a surface over a structural aspect of the integrated circuit device. Metal layers are formed in an insulating material below the surface, and a plurality of via network layers are formed in the insulating material between the metal layers. Each via network layer includes a plurality of via strips extending about parallel to the surface and in different directions to facilitate structural support of a bond pad contact over the via strips, the via strips connecting the bond pad contact to the metal layers.

Another example embodiment is directed to an integrated circuit device having a plurality of metal layers separated by an inter-metal dielectric layer, a top inter-metal dielectric layer on an upper one of the metal layers, and a plurality of bond pad stacks. Each bond pad stack includes a bond pad contact extending laterally along a surface of the top inter-metal dielectric layer. In each of the inter-metal dielectric layers below the bond pad contact, a network of interconnected via strips extend about parallel to the bond pad contact and in different directions to facilitate structural support of the bond pad contact, with the via strips for each bond pad contact being separated from the via strips for other bond pad contacts by the inter-metal dielectric layer.

The above discussion is not intended to describe each embodiment or every implementation of the present disclosure. The figures and following description also exemplify various embodiments.

Various example embodiments may be more completely understood in consideration of the following detailed description in connection with the accompanying drawings, in which.

Figure 1A:
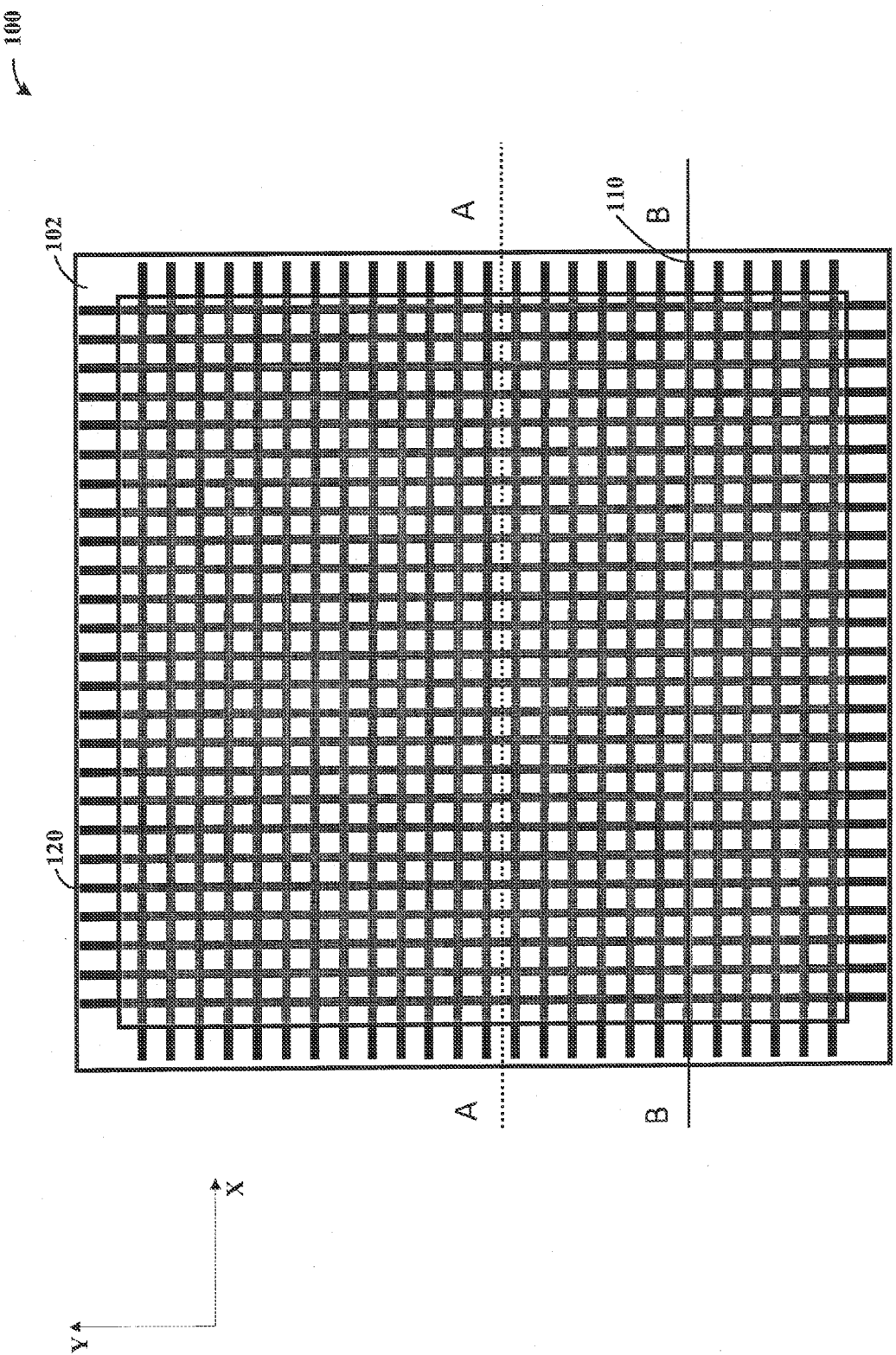
FIGS. 1A-1C show a pad stack with a via network arrangement in top and cross-section views, in accordance with an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined in the claims. Furthermore, the term "example" as used throughout this document is by way of illustration, and not limitation.

The present invention is believed to be applicable to a variety of different types of circuits, devices and arrangements involving the use of bond pads, bump pads or other circuit connectors. While the present invention is not necessarily limited in this context, various aspects of the invention may be appreciated through a discussion of related examples.

According to an example embodiment, a circuit connector network includes bond or bump pad contacts each connected to a network or networks of via strips that support the bond or bump pad contacts in one or more layers below the pad contacts. Each network includes laterally-connected structures that provide strength to the bond or bump pad contacts. One or more of a variety of materials can be used to form the via networks, which can be manufactured as part of an integrated circuit in connection with the formation of other circuit components (e.g., as part of the formation of metal layers that connect functional circuit components (e.g., transistors) to pad contacts). The via strips are formed in a variety of arrangements and quantities to suit different applications, such as in a crossing pattern, radial pattern and in other patterns, with the number of via strips set to suit bond pad connections and/or to meet a desired network strength.

The via network may, for example, be used to support the bond and/or bump pad contacts to mitigate or eliminate mechanical damage that may occur due to probing, wire bonding or metal bumping such as may be relevant to the manufacture, packaging, assembly or testing of an integrated circuit chip. In various implementations, the network facilitates or otherwise enhances the adhesion of metal layers with underlying inter-metal dielectric (IMD) layers, to mitigate or prevent peeling of the pad metal. In various contexts, the bond pad or bump pad contacts are part of a bond pad or bump pad stack (which may simply be referred to as a bond pad or bump pad), including a stack of materials including underlying metal and dielectric layers supporting the pad contact as discussed herein.

In some implementations, the via network is configured to sufficiently support bond and/or bump pad stacks to facilitate the placement of the pad stacks above active areas of an integrated circuit device (e.g., for a bond-on-active implementation). In certain implementations, the via network is configured to sufficiently support bond and/or bump pad stacks using Cu or Al wires in place of Au in applications in which Au has been used. In these implementations, sufficiently support refers to an amount of support that prevents cracking of a portion of the pad stack (e.g., dielectric material and/or metal layers below the upper bond and/or bump pad contacts), for coupling the pads to an external circuit under substantially all (e.g., at least 95%) of the connection conditions for an application in which the via network is used.

A variety of materials may be used as bond pad contacts, vias and/or interconnects, in accordance with one or more embodiments described herein. For example, W or Cu may be used to form a via network that supports bond and/or bump pad contacts as discussed herein. Materials such as Ti, TiN, TiW, W, or TiTa can be used as barrier materials for contact/via plugs (e.g., with via strip networks made of W or Cu). Inter-metal dielectrics (IMDs) such as silicon, oxide, silicon oxide (TEOS or silane-based), silicon oxynitride, silicon nitride, nitride and/or various low-k materials can also be used.

In various implementations, the via networks are manufactured such that layers in which IMDs are present in a bond-pad stack (including one or more pad-specific supporting via networks) are metal-dominated metal-IMD mixed layers. The metal-IMD mixed layers are formed sufficiently strong (e.g., not brittle) and rigid to sustain high shear forces and distribute the energy in a wider area (e.g., around the edge of a bonding ball) so that macro cracking in the IMDs is mitigated or eliminated via the presence of the metal via network. For instance, such cracking can occur during probing (e.g., during e-sort probing), wire-bonding or metal bumping during chip package/assembly. In some embodiments, at least some of the metal layers of the pad stack are in a metal plate, with certain implementations excepting a top metal layer.

The number, location and interconnectivity of the vias in each via network can be set to suit particular applications. For example, a ratio of via network to IMD in a particular layer may be between 0.3 and 0.75. In some embodiments, the pads and via networks are configured and arranged in proportion to the coverage of the via-network(s) in the IMDs of an integrated circuit chip, further in proportion to the $3^{rd}$ power of the thickness of the IMDs in which the via-networks are made. In some implementations, the pad strength is increased by also increasing the thicknesses of the IMDs, such as the top IMD (e.g., a 25% increase in IMD thickness can be used to effect a 95% increase of the strength/rigidity of a bond pad formed thereon).

In some embodiments, the via network includes various levels arranged relative to a surface on which bond pad contacts are connected to the via network. In some implementations, different materials and/or different via dimensions are used at different positions in the network, to tailor the strength of the network in select locations where needed, while also saving cost in materials, manufacturing or otherwise in other portions of the network. For example, a strong material such as tungsten can be used in a via network layer (or layers) nearest bond pad contacts to be supported, while less expensive (and often lower strength) material is used in other portions of the network.

As characterized in various embodiments herein, reference is made to bond pads or bumps, as corresponding to a connection as may be made, for example, from an integrated circuit device to external components. In these contexts, the terms bond pads and bumps or bump pads (e.g., as referring to contacts or stacks) are generally interchangeable with each other and other characterizations as generally applicable to circuit connectors at or near a surface of an integrated circuit or other component such as a printed circuit board.

Various other example embodiments are directed to methods of forming via networks for supporting bond pad contacts, and related integrated circuit devices. In a particular embodiment, an integrated circuit device is formed as follows. Metal layers and IMD layers are alternately formed, to subsequently form a (top) bond pad metal contact layer. Within one or more of the IMDs, a via network is formed to support the bond pad metal contact layer. In some implementations, trenches are formed in the IMD in a pattern to set the pattern of the via strips. The trenches are formed in a direction that is about parallel to the surface at which the bond pad is located, and in different directions to facilitate structural support of a bond pad contact over the via strips. The via strips are then formed in the trenches, and may electrically connect the bond pad contacts to the metal layers. In certain embodiments, electrical connection of the bond pads (e.g., the upper contact portion thereof) is made to other metal layers via other circuit connectors, independently and/or together with the via strips.

In some embodiments, the via strips are formed to intersect one another and form an overlapping, or grid, type of pattern. For example, the via strips may be arranged in X- and Y-directions, in three or more directions, one or more degrees relative to one another, extending in an arc, and extending in a radial direction. The via strips can also be formed substantially within a portion of a device below a bond pad to which the via network layers are connected. In addition, the material, thickness and arrangement of the via strips can be set as discussed elsewhere herein, to suit particular applications. In addition, the IMD layers can be formed to a particular thickness to facilitate desirable support (e.g., an upper IMD layer immediately below a bond pad contact can be made thicker to facilitate increased support).

The via strips as discussed herein can be formed with a variety of processes, such as Al-interconnect-W-via-plug process technologies and Cu-interconnect/via damascene technologies, to pads in which two metal levels one above another are of the same electrical potential, or in which a lower metal layer is not included with a bond pad stack. For Cu-interconnect/via damascene embodiments, a thicker barrier layer can be used for a top metal to increase suppression of mechanical damages to bond pad stacks. In addition, vertical via strips at all levels where vias are used can be aligned/overlapped with each other.

Various fabrication approaches can be implemented in connection with different embodiments. For Al interconnect with W via plug technologies, Al metal is deposed and patterned, followed by the deposition of inter-metal dielectrics IMD and planarization thereof. Via-holes and via strips are then formed in the IMDs and filled with W. Each subsequent level is thus formed, beginning again with Al metal deposition. For Cu interconnect technologies, dielectric material is deposited and planarized, followed by the formation of via hole/via strip openings and metal trenches. The via holes/strips and metal trenches are filled with Cu, and the process continues again at a next level starting with dielectric deposition.

Figure 1B:
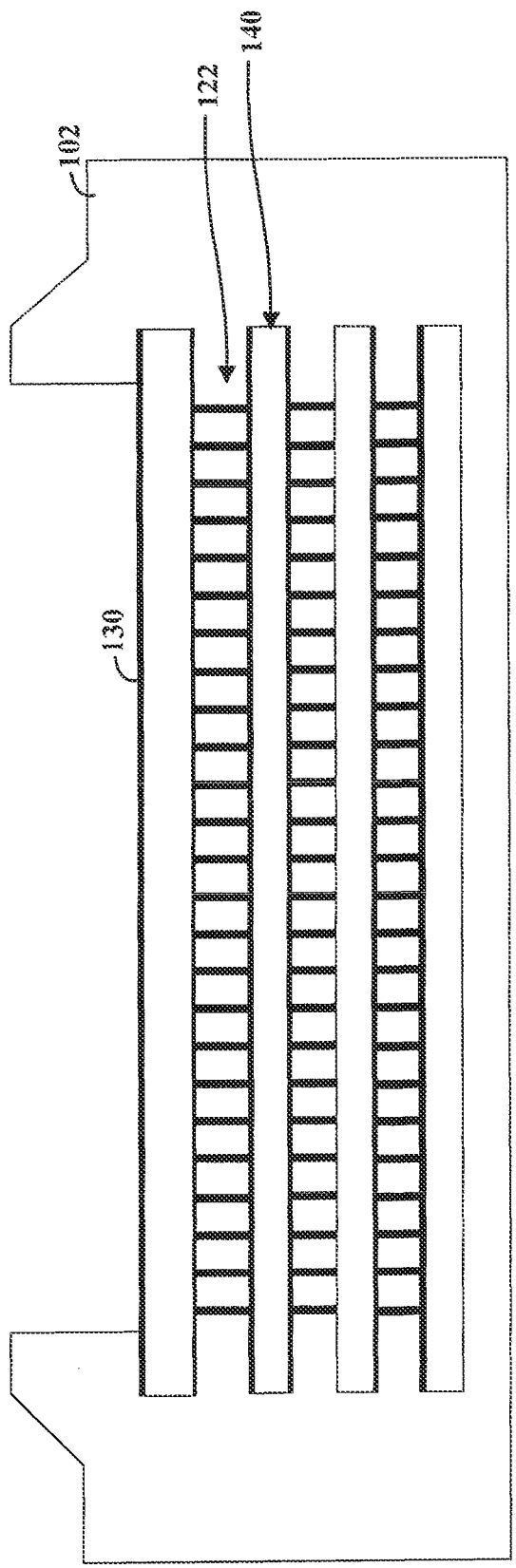
Figure 1C:
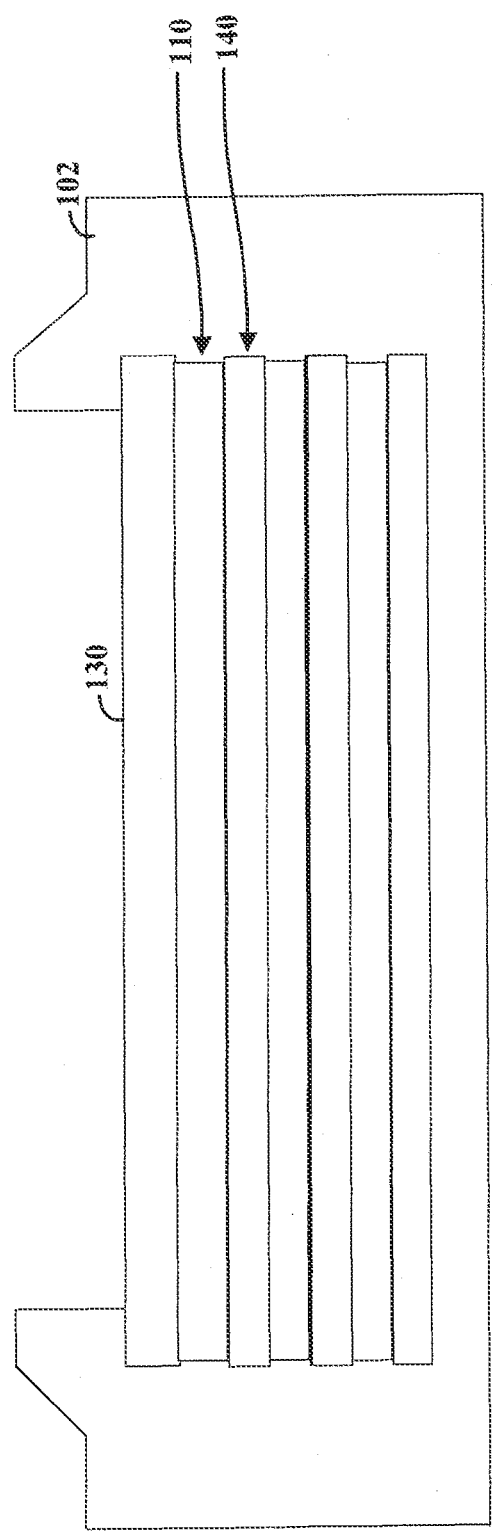

Turning now to the figures, FIGS. 1A-1C show a bond pad stack with via network arrangement 100 in top and cross-section views, in accordance with another example embodiment of the present invention. Of the three views, FIG. 1A shows a top view of the via network arrangement, and FIG. 1B and FIG. 1C respectively show cross-sections A-A and B-B as shown in FIG. 1A.

Beginning with the top view in FIG. 1A, the via network arrangement 100 includes a plurality of via strips intersecting and/or crossing over one another in both x- and y-directions (e.g., relative to a lateral direction in an integrated circuit device). The via strips in the x-direction include via strip 110 (at cross section B-B), and the via strips in the y-direction include via strip 120. The strips are in one or more insulating types of materials (e.g., a dielectric) 102, which also supports the strips.

Referring to section A-A in FIG. 1B, a bond pad contact 130 is formed at an upper surface, and over a via network including a plurality of via strips 122 extending in the y-direction and about parallel to the surface, as relative to FIG. 1A. The via strips 122 support the bond pad contact 130 and also connect the bond pad contact to a metal layer 140 underneath. Additional via strips and (alternating) metal layers are shown underneath metal layer 140 by way of example (fewer or more via networks may be used to suit different embodiments). The connection of the bond pad to the metal layer 140 may include an electrical connection, such as for connecting to circuit components. Other electrical connections may also be employed (e.g., directly to the bond pad contact 130), with the shown metal layers generally used as support and not necessarily facilitating any electrical connection as implemented, for example, in the operation of an integrated circuit.

Referring to section B-B in FIG. 1C, the bond pad contact 130 is on via strip 110, which extends in the x-direction relative to FIG. 1A and also about parallel to the upper surface. The length of the via strip 110 thus extends to about the same length as the bond pad contact 130, with substantially all (e.g., most, or nearly all) of the via strip being below the bond pad. The length of a via strip corresponds to a length in a long direction (x and y) relative to a thickness (e.g., a length of at least an order of magnitude greater than thickness). Accordingly, various bond pads can be supported with via network stacks, each bond pad having its own stack, such as for implementation with an integrated circuit type of device.

The device 100 can be implemented in a variety of manners. For example, and as consistent with the above, the device may include a plurality of bond pads and supporting via network stacks as shown, as part of an integrated circuit chip. The device 100 may also couple to or house an integrated circuit chip, and provide interconnectivity thereto.

As also consistent with the above, the device 100 (or those shown in other figures and discussed below) may include a variety of different materials and sizes of via strips to suit particular applications. In one instance, a first one of the via network layers nearest the bond pads (e.g., 122 and 110 in FIGS. 1B and 1C) includes via strips of a first material that is different than a second material of via strips in other ones of the via interconnect layers (e.g., below metal layer 140). For example, the strips 122 and 110 may be formed of a material having a higher yield strength (e.g., relative to a force at which the material begins to deform plastically), relative to via strips in underlying layers. This approach facilitates the use of less expensive materials or materials of other desirable characteristics in underlying via networks, while limiting the use of high yield strength material to an upper via network to sufficiently support a bond pad contact 130.

As another example embodiment involving varying via strips, the via strips in a layer or layers nearest the bond pad (e.g., 122 and 110 in FIGS. 1B and 1C) are formed having a larger cross-section than underlying via strips. This facilitates greater strength to support the bond pad contact 130 while preserving material in underlying layers. The thickness and number of vias can also be tailored to suit an expected force applied to the bond pad contact, to balance materials and manufacturing cost with strength of the strips. Still other embodiments involve both material and thickness changes in different via network layers, to suit similar needs.

Figure 2:
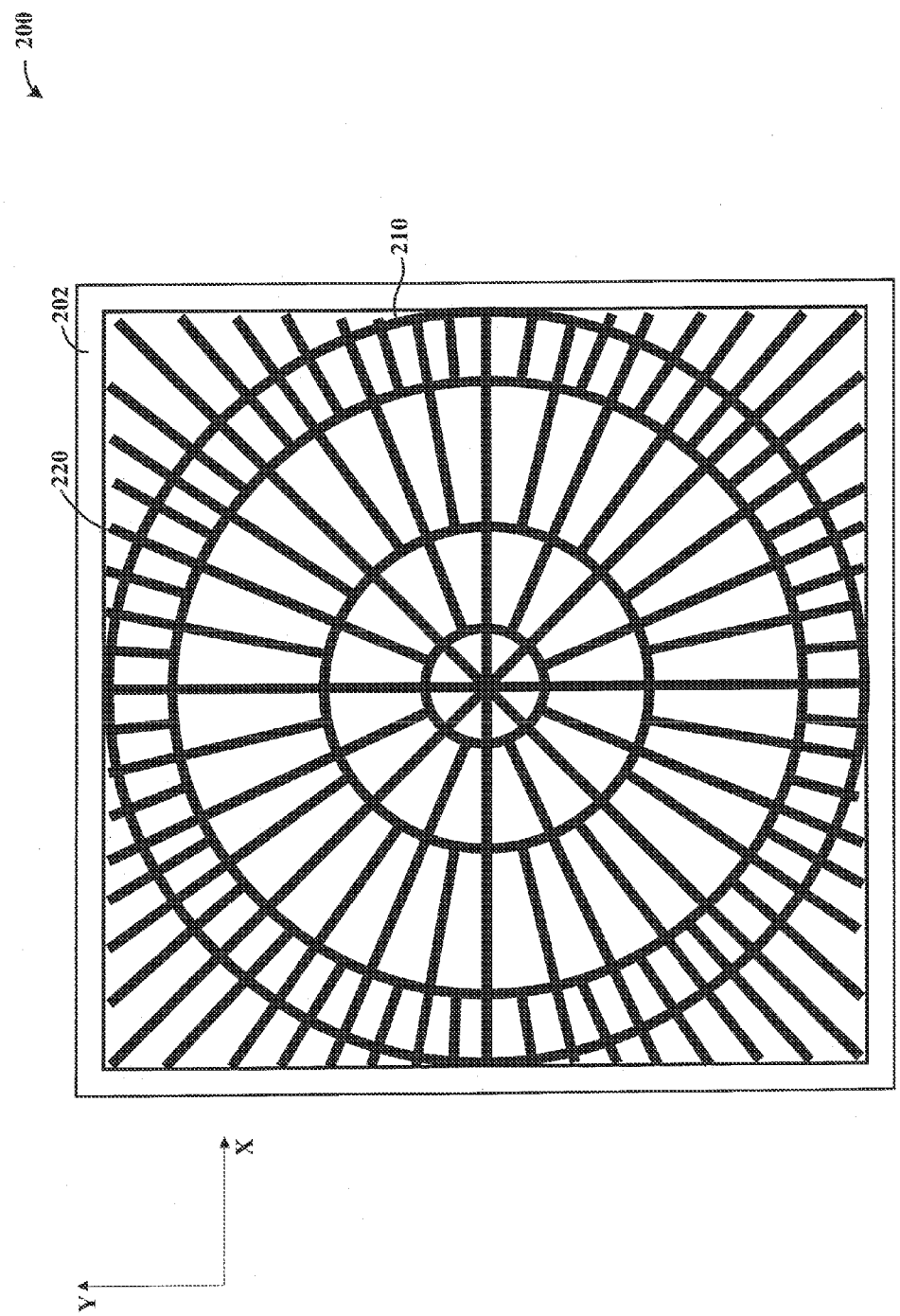
FIG. 2 shows a via network, in accordance with another example embodiment of the present invention.

Referring to FIG. 2, a via network 200 includes via strips extending in an arc-type (e.g., circular) direction, and via strips extending in a radial direction, in accordance with another example embodiment of the present invention. The arc-type vias include via 210, and the radial vias include via 220, located in an insulative material 202 and respectively labeled by way of example. The via network 200 can be formed in one or more IMD layers to support a bond pad contact, such as bond pad contact 130 in FIG. 1A.

Figure 3:
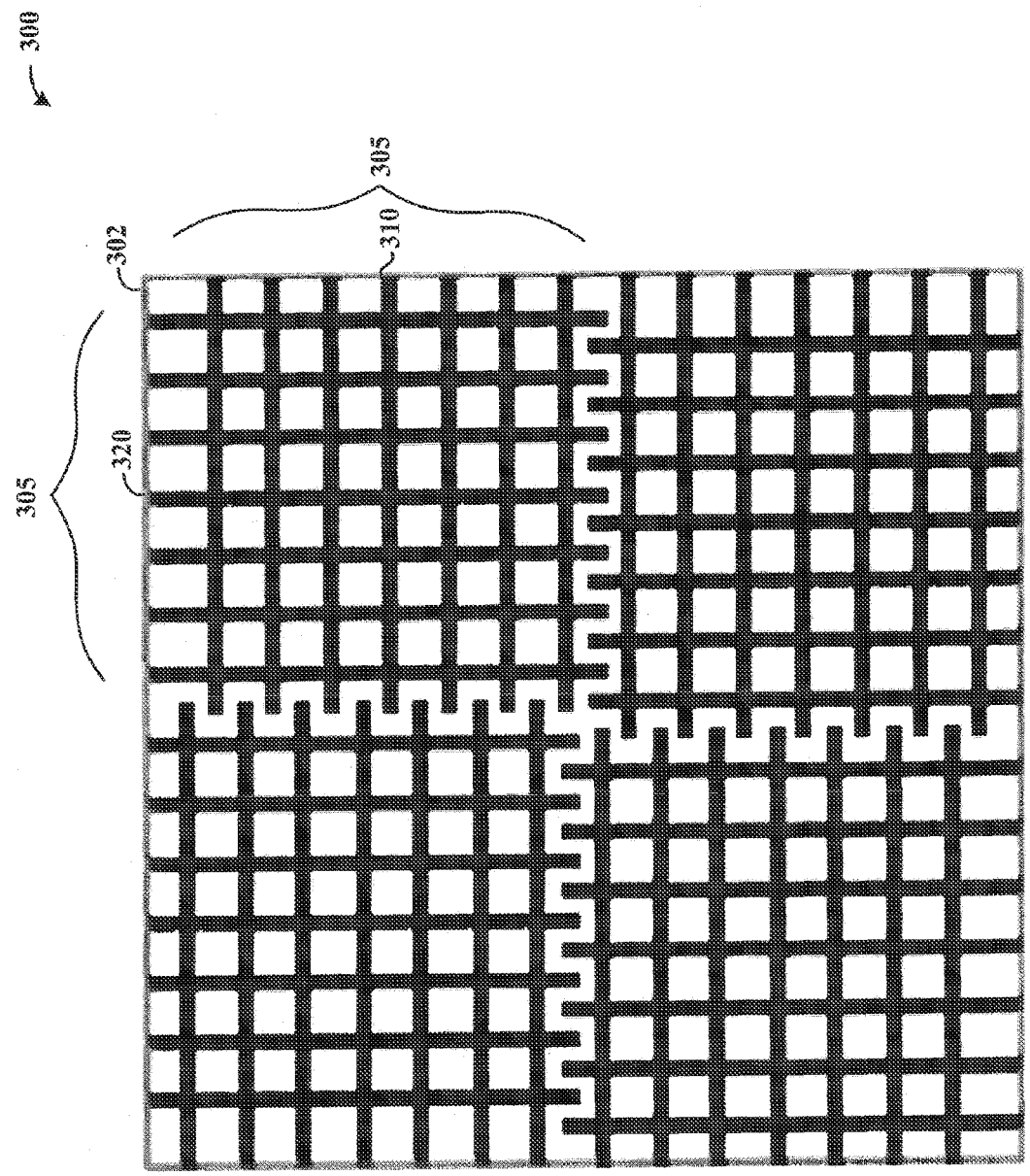
FIG. 3 shows another via network, in accordance with another example embodiment of the present invention.

FIG. 3 shows another via network arrangement 300 with four separate groupings of via strips in a network layer, in accordance with another example embodiment of the present invention. By way of example, a via sub-network grouping 305 is labeled, and has vias in the x-direction and y-direction respectively including vias 310 and 320, formed in an insulating type of material 302. Other embodiments are directed to fewer or more such groupings. In some implementations, the via groupings overlap one another and/or are coupled to one another to further support overlying bond pads.

FIG. 4 shows another pad and via network 400 in top (FIG. 4A) and cross-section (FIGS. 4B, 4C and 4D) views, according to another example embodiment of the present invention. In FIGS. 4A-4D, layers of via networks similar to those shown in FIGS. 1A-1C are used to support an overlying bond pad contact, with metal layers also formed in a grid-like pattern.

Figure 4A:
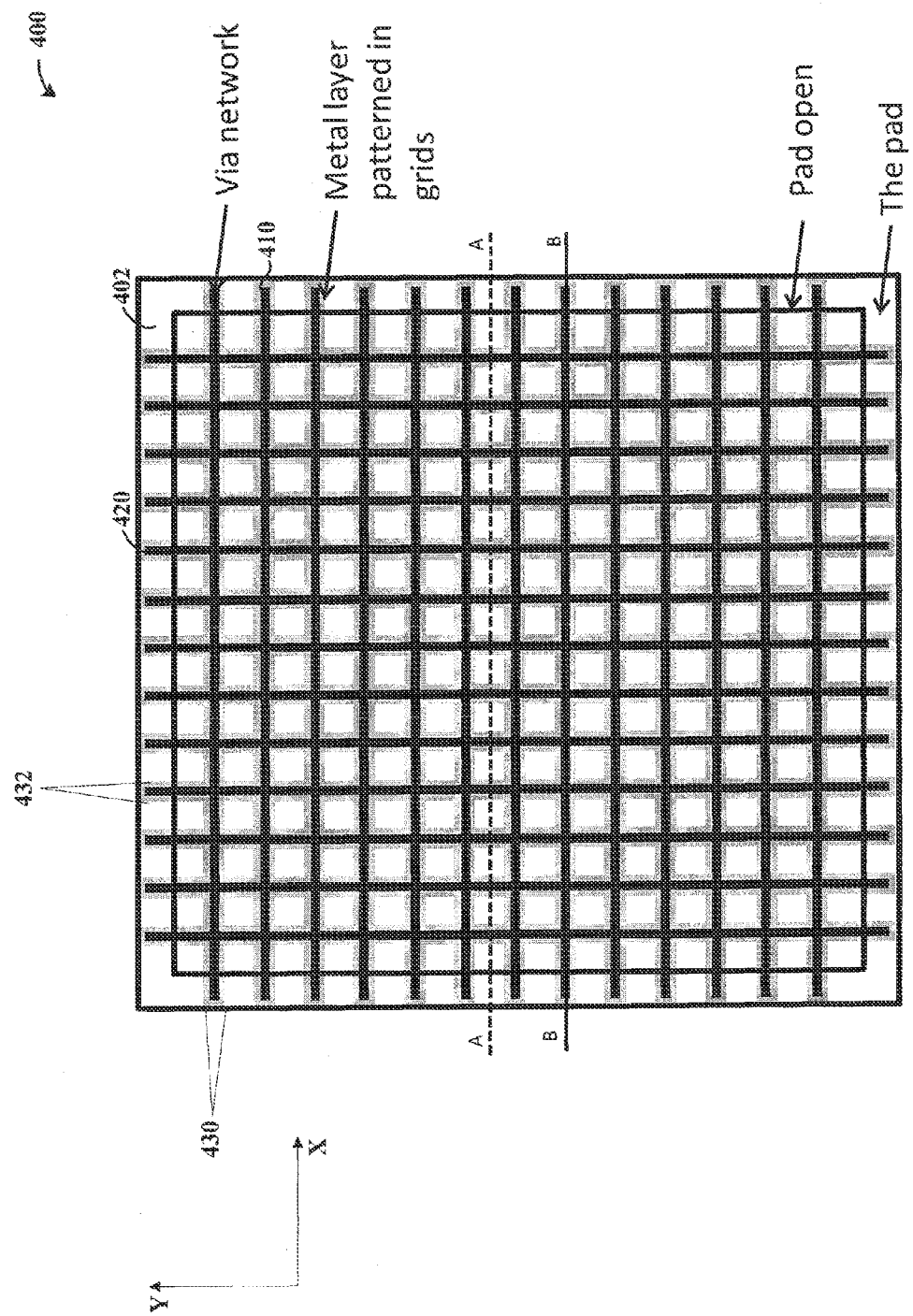
FIGS. 4A-4D show another pad stack and via network in top and cross-section views, according to another example embodiment of the present invention.

Beginning with FIG. 4A, via strips are patterned in x- and y-directions with strips 410 and 420 labeled by way of example, in an insulating material 402. One or more underlying metal layers are also patterned in a similar manner, with metal layer strips 430 and 432 respectively labeled by way of example, extending in the x- and y-directions.

Figure 4B:
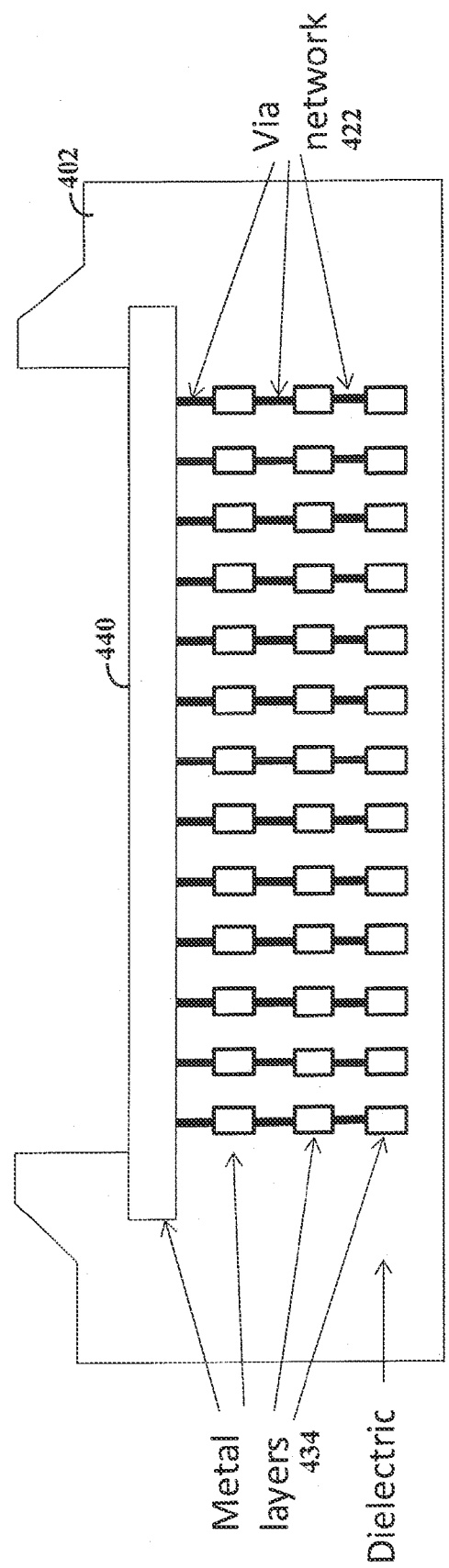
Figure 4C:
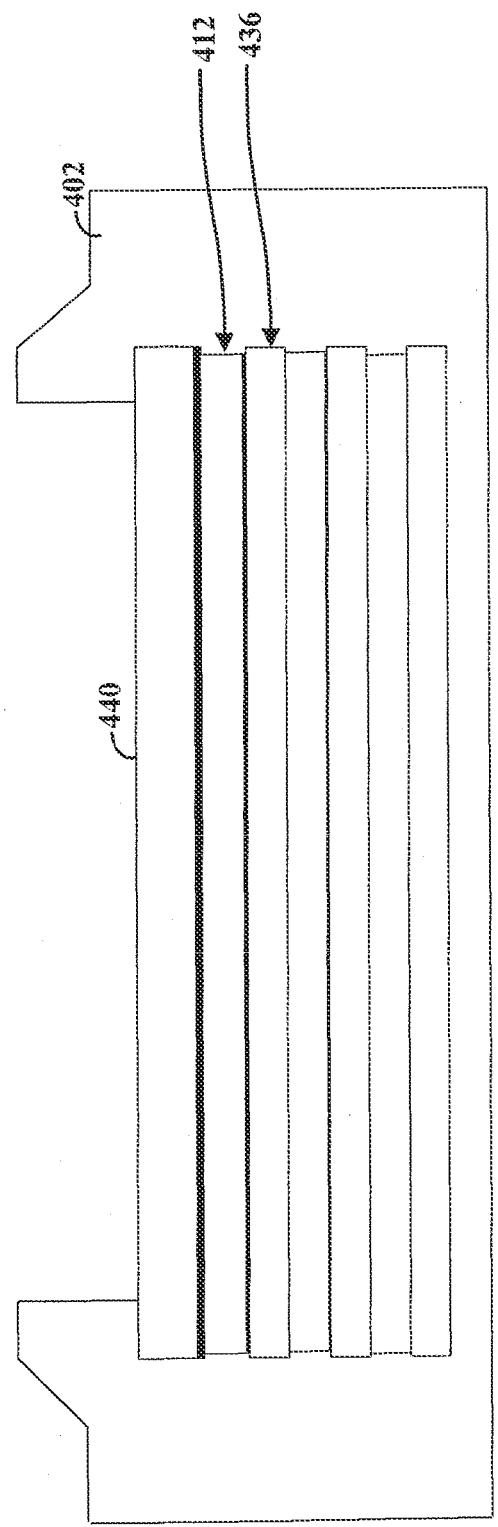
Figure 4D:
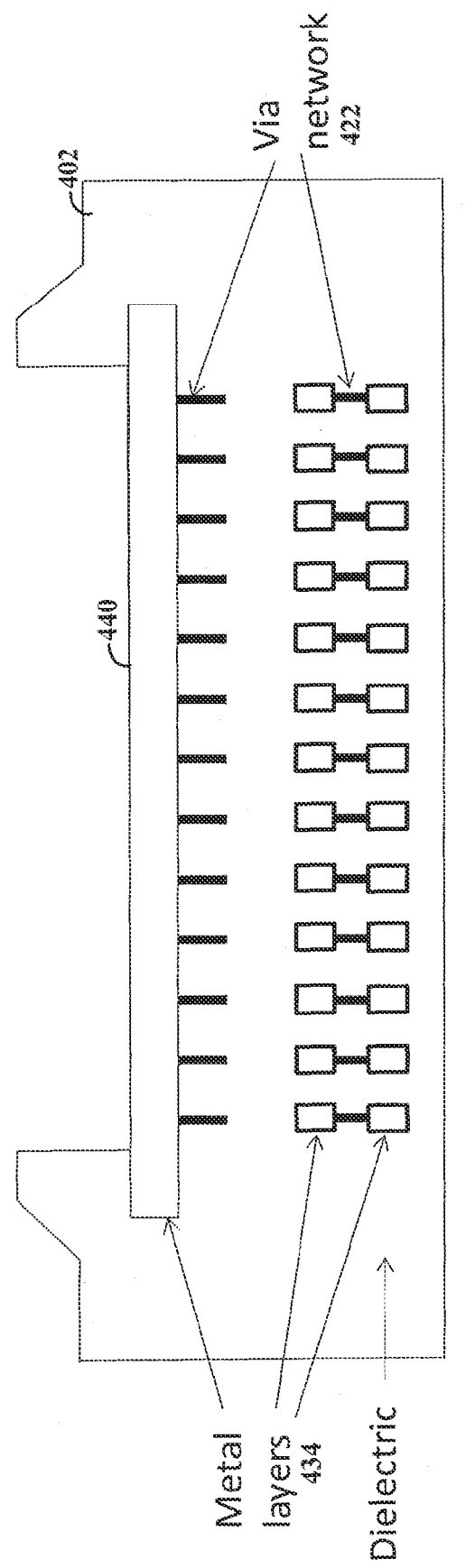

Referring to FIG. 4B, showing cross-section A-A from FIG. 4A, a bond pad contact 440 is supported by via networks including via strips 422 extending in the y-direction. Metal layers 434 are also patterned in strips, with strips 434 extending in the y-direction as well. Referring to FIG. 4C, via strips 412 extend in the x-direction, alternating between metal layers including the bond pad contact 440 and layer 436. This approach to patterning metal layers may, for example, also be carried out in connection with the use of other patterning approaches, such as shown in the other figures, for one or both of the via strips and the metal layers. Referring to FIG. 4D, another embodiment involving cross-section A-A from FIG. 4A is shown. Bond pad contact 440 is supported by via networks including via strips 422 extending in the y-direction. Metal layers 434 are also patterned in strips, with strips 434 extending in the y-direction as well (e.g., as may be implemented, for example, in the absence of an upper metal and via network in a bond pad stack as shown). Upper vias are shown separated from lower layers.

Based upon the above discussion and illustrations, those skilled in the art will readily recognize that various modifications and changes may be made to the present invention without strictly following the exemplary embodiments and applications illustrated and described herein. For example, the orientation of the layers, relative to terms "above" and "below" may be modified (e.g., devices turned sideways or upside down), while maintaining the spatial relationship as shown in the figures and/or described herein. Also, while the via networks shown in the figures are represented with relatively few via strips for exemplification, a multitude of such strips may be implemented under respective bond pads, and at a smaller separation distance between the strips than that shown. The number of strips can also be set to facilitate a desired strength level, which may be tailored to a particular application. Bond pad contacts in other forms (e.g., square, rectangular, circular, octal or oval) can be supported, in terms of the shape of metal layers and/or open area of the bond pads. In addition, variations in thickness, width and other structural characteristics may be made, while generally providing support in a via network structure as described herein. The via networks may also be coupled to other vias, such as point vias extending about perpendicular to a bond pad. Such modifications do not depart from the true spirit and scope of the present invention, including that set forth in the following claims.

What is claimed is:

1. A method for manufacturing an integrated circuit device providing a surface over a structural aspect of the integrated circuit device, the method comprising:

in a first insulating material, forming a first via network layer that includes a first plurality of metal via strips that extend about parallel to the surface and in different directions to facilitate structural support of the bond pad contact over the via strip and that each contact and extend between a bond pad contact and a first metal layer;

forming, in a second insulating material, a second via network layer that includes a second plurality of metal via strips that extend about parallel to the surface and in different directions to facilitate structural support of the bond pad and that each contact and extend between the first metal layer and a second metal layer, wherein the via strips of the first via network are made from a first type of metal and the via strips of the second via network are made from a second type of metal that has a lower yield strength than the first type of metal.

2. The method of claim 1, wherein forming the first via network layer includes forming a plurality of trenches in the first insulating material, the trenches extending about parallel to the surface, and filling the trenches with a conductive material to form the first plurality of via strips.

3. The method of claim 1, wherein forming the first via network layer includes forming intersecting via strips in the first via network layer.

4. The method of claim 1, wherein forming the first via network layer includes forming the via network substantially within a portion of the device directly below the bond pad contact and extending perpendicular to the surface.

5. The method of claim 1, wherein forming the first via network layer includes forming, in the first via network layer nearest the bond pad contact, via strips of a larger cross-section than via strips in the second via layer further from the bond pad contact than the first via network layer.

6. The method of claim 1, further comprising forming the first insulating material with a first thickness, and forming the second insulating material with a second thickness that is less than the first thickness.

7. The method of claim 1, wherein the ratio of via strip material to first insulating material in the first via network is between 0.3 and 0.75.

8. The method of claim 1, wherein the first type of metal is primarily tungsten.

9. The method of claim 1, wherein the first type of metal includes at least one metal selected from the group comprising tungsten and copper and wherein the first via network further includes a barrier layer that includes titanium.

* * * * *